(12) United States Patent
Gillis et al.

(10) Patent No.: US 8,169,055 B2
(45) Date of Patent: May 1, 2012

(54) CHIP GUARD RING INCLUDING A THROUGH-SUBSTRATE VIA

(75) Inventors: John D. Gillis, Floridale, FL (US); Wan Ni, Carlsbad, CA (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 12/634,726

(22) Filed: Dec. 10, 2009

(65) Prior Publication Data

US 2010/0237472 A1    Sep. 23, 2010

Related U.S. Application Data

(60) Provisional application No. 61/161,111, filed on Mar. 18, 2009.

(51) Int. Cl.
*H01L 23/48* (2006.01)
*H01L 21/768* (2006.01)

(52) U.S. Cl. ....................................................... 257/621

(58) Field of Classification Search ................... 257/621, 257/664–665, 734–786, E29.111–E29.165, 257/E23.01–E23.079, E21.135–E21.21, E21.627, 257/127, 396, 52, 62, E29.003, E21.597, 257/678, 276, E21.641, E23.153, 698; 438/106, 438/629, 630, 637–640, 668, 672, 675
See application file for complete search history.

(56) References Cited

U.S. PATENT DOCUMENTS

| 5,608,264 | A | 3/1997 | Gaul |
| 5,998,292 | A | 12/1999 | Black et al. |
| 6,569,762 | B2 | 5/2003 | Kong |
| 6,593,644 | B2 | 7/2003 | Chiu et al. |
| 6,608,371 | B2 | 8/2003 | Kurashima et al. |
| 6,924,551 | B2 | 8/2005 | Rumer et al. |
| 7,633,167 | B2 * | 12/2009 | Kawano et al. ............... 257/774 |
| 7,902,613 | B1 * | 3/2011 | Pierrat ........................ 257/396 |
| 2002/0020862 | A1 * | 2/2002 | Livengood et al. .......... 257/276 |
| 2005/0212126 | A1 * | 9/2005 | Sunohara ..................... 257/730 |
| 2006/0065969 | A1 * | 3/2006 | Antol et al. .................. 257/700 |

(Continued)

OTHER PUBLICATIONS

Marinis et al., "Wafer Level Vacuum Packaging of MEMS Sensors", 2005 Electronic Components and Technology Conference, May 31-Jun. 3, 2005, pp. 1081-1088.

(Continued)

*Primary Examiner* — Dao H Nguyen
*Assistant Examiner* — Tram H Nguyen
(74) *Attorney, Agent, or Firm* — Scully, Scott, Murphy & Presser, P.C.; Anthony J. Canale

(57) ABSTRACT

At least one through-substrate via is formed around the periphery of a semiconductor chip or a semiconductor chiplet included in a semiconductor chip. The at least one through-substrate via may be a single through-substrate via that laterally surrounds the semiconductor chip or the semiconductor chiplet, or may comprise a plurality of through-substrate vias that surrounds the periphery with at least one gap among the through-substrate vias. A stack of back-end-of-line (BEOL) metal structures that laterally surrounds the semiconductor chip or the semiconductor chiplet are formed directly on the substrate contact vias and electrically connected to the at least one through-substrate via. A metallic layer is formed on the backside of the semiconductor substrate including the at least one through-substrate via. The conductive structure including the metallic layer, the at least one through-substrate via, and the stack of the BEOL metal structures function as an electrical ground built into the semiconductor chip.

20 Claims, 9 Drawing Sheets

U.S. PATENT DOCUMENTS

| | | | |
|---|---|---|---|
| 2006/0226535 A1* | 10/2006 | Antol et al. | 257/698 |
| 2007/0069364 A1* | 3/2007 | Kawano et al. | 257/698 |
| 2008/0048337 A1* | 2/2008 | Takahashi et al. | 257/774 |
| 2008/0073747 A1 | 3/2008 | Chao et al. | |
| 2008/0237856 A1* | 10/2008 | Hisada et al. | 257/738 |
| 2009/0152602 A1* | 6/2009 | Akiyama | 257/288 |
| 2009/0215261 A1* | 8/2009 | Kawano | 438/643 |
| 2009/0267233 A1* | 10/2009 | Lee | 257/758 |
| 2011/0101541 A1* | 5/2011 | Kawano et al. | 257/774 |

OTHER PUBLICATIONS

U.S. Appl. No. 11/669,924, entitled "Structure and Method for Creating Reliable Deep Via Connections in a Silicon Carrier", filed Jan. 31, 2007, First Named Inventor: Paul S. Andry.

* cited by examiner

CHIP GUARD RING INCLUDING A THROUGH-SUBSTRATE VIA

FIELD OF THE INVENTION

The present invention relates to semiconductor structures, and particularly to a chip guard ring (also called a chip seal ring or a die seal) structure including a through-substrate via, and methods of manufacturing the same.

BACKGROUND OF THE INVENTION

A chip guard ring typically comprises a stack of back-end-of-line (BEOL) metal interconnect structures that are located on an outer periphery of a semiconductor chip. The chip guard ring functions as a metal seal against ionic contaminants. The chip guard ring also functions as a low resistance path between electrical ground nodes of semiconductor devices on the semiconductor substrate and grounding metal pads located on the top surface of dielectric layers including back-end-of-line metal interconnect structures of the semiconductor chip. Typically, multiple grounding metal pads are required to provide adequate grounding of the semiconductor chip's guard ring. The grounding metal pads may be C4 flip chip pads or wirebond pads.

On one hand, an increase in the number of grounding pads on the guard ring provides enhanced grounding of the semiconductor circuit in a semiconductor chip. By providing sufficient electrical grounding, spurious signals on the guard ring and in the substrate around the guard ring area are blocked and the voltage at the electrical ground at the semiconductor chip is stabilized to provide higher performance. On the other hand, the number of the grounding pads on the guard ring needs to be minimized to reduce the size of the semiconductor chip because each grounding metal pad requires additional area for the semiconductor chip. The minimized number of the pads is also important to reduce the bonding cost of the chip package. Excessive reduction in the number of the grounding metal pads may result in degraded circuit performance through insufficient blocking of spurious signals to the guard ring electrical ground of the semiconductor chip. These two contradicting requirements make the design of a compact high performance semiconductor chip difficult.

SUMMARY OF THE INVENTION

The present invention provides a semiconductor structure that enables sufficient grounding of a semiconductor chip's seal ring without employing grounding metal pads, and thereby minimizing the area for the semiconductor chip without degrading performance, or actually improving the performance, of the semiconductor chip. The grounding method used is superior to previously used flip chip bumps and/or wire bond pads because of reduced inductance.

In the present invention, at least one through-substrate via is formed around the periphery of a semiconductor chip or a semiconductor chiplet included in a semiconductor chip. The at least one through-substrate via may be a single through-substrate via that laterally surrounds the semiconductor chip or the semiconductor chiplet, or may comprise a plurality of through-substrate vias that surrounds the periphery with at least one gap among the through-substrate vias. A stack of back-end-of-line (BEOL) metal structures that laterally surrounds the semiconductor chip or the semiconductor chiplet are formed directly on the at least one through-substrate via. A metallic layer is formed on the backside of the semiconductor substrate including the at least one through-substrate via. The conductive structure including the metallic layer, the at least one through-substrate via, and the stack of the BEOL metal structures function as an electrical ground built into the semiconductor chip. Typically, grounding of the metallic layer is effected with conductive epoxy or solder applied to the metallic layer and to the electrical ground structure.

According to an aspect of the present invention, a semiconductor structure is provided, which includes: a semiconductor device located on a semiconductor substrate; at least one through-substrate via extending from a bottom surface of the semiconductor substrate and at least to a top surface of the semiconductor substrate and located within a peripheral region of the semiconductor substrate; at least one dielectric material layer located on the semiconductor device and embedding at least one metal interconnect structure; a metallic enclosure structure laterally surrounding and enclosing an inner portion of the at least one dielectric material layer and vertically abutting a top surface of the at least one through-substrate via; and a metallic layer vertically abutting a bottom surface of the at least one through-substrate via and a bottom surface of the semiconductor substrate.

According to another aspect of the present invention, a method of forming a semiconductor structure is provided, which includes: forming at least one through-substrate via and at least one substrate contact via within a peripheral region of a semiconductor substrate; forming at least one dielectric material layer and at least one metal interconnect structure embedded therein on the semiconductor substrate; forming a metallic enclosure structure directly on the at least one through-substrate via, wherein the metallic enclosure structure laterally surrounds and encloses an inner portion of the at least one dielectric material layer; and forming a metallic layer directly on a bottom surface of the at least one through-substrate via and a bottom surface of the semiconductor substrate.

DETAILED DESCRIPTION OF THE INVENTION

Figure 1:
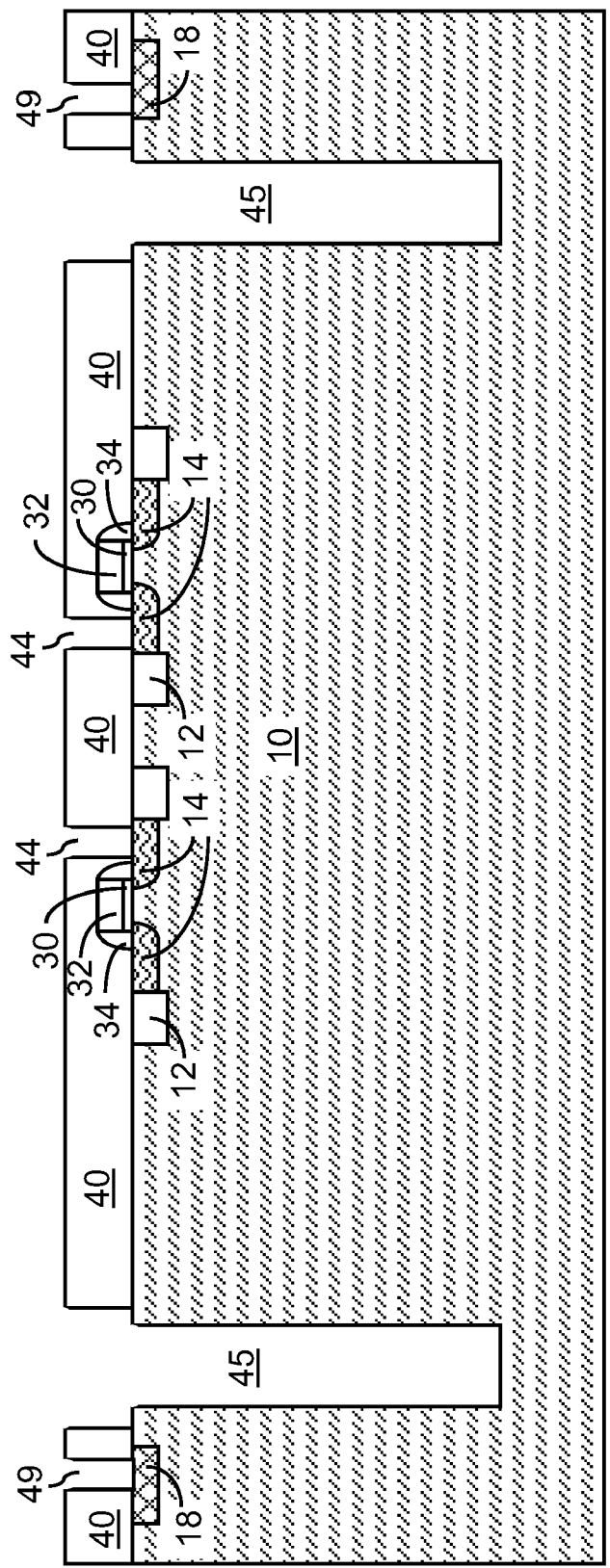
FIGS. 1, 2, 3, and 4A are sequential vertical cross-sectional views of a first exemplary semiconductor structure according to a first embodiment of the present invention.

As stated above, the present invention relates to a chip guard ring structure including a through-substrate via and methods of manufacturing the same, which are described herein with accompanying figures. Throughout the drawings, the same reference numerals or letters are used to designate like or equivalent elements. The drawings are not necessarily drawn to scale.

Referring to FIG. 1, a first exemplary structure according to a first embodiment of the present invention includes a semiconductor substrate 10 having at least one semiconductor device formed on a surface thereof. For example, the at least one semiconductor device may include a field effect transistor including source and drain regions 14, a gate dielectric 30, a gate electrode 32, and a gate spacer 34. Shallow trench isolation structures 12 may provide electrical separation between semiconductor devices.

The semiconductor substrate 10 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. The semiconductor substrate 10 may be a bulk substrate, a semiconductor-on-insulator (SOI) substrate, or a hybrid substrate having a bulk portion and a semiconductor-on-insulator portion.

At least one doped semiconductor well 18 is formed on the top surface of the semiconductor substrate 10 along a peripheral region. The at least one doped semiconductor well 18 may be a single contiguous doped semiconductor well along a peripheral region of the semiconductor substrate 10, or may include of plurality of disjoined doped semiconductor wells along a peripheral region of the semiconductor substrate 10. Typically, the at least one doped semiconductor well 18 is single crystalline and is epitaxially aligned to the semiconductor substrate 10. The at least one doped semiconductor well 18 may have the same type of doping as the semiconductor substrate 10 to facilitate electrical grounding of the semiconductor substrate employing through-substrate vias to be subsequently formed.

A substrate-contact-via level dielectric material layer 40 is formed on the top surface of the semiconductor substrate 10 and the at least one semiconductor device. The substrate-contact-via level dielectric material layer 40 includes a portion that abuts the top surface of the semiconductor substrate 10 and the at least one semiconductor device. Substrate contact vias (not shown) extending to the top surface of the semiconductor substrate 10 are subsequently formed in the substrate-contact-via level dielectric material layer 40. The substrate-contact-via level dielectric material layer 40 may comprise an oxide based conventional dielectric material or a low-k dielectric material. Typically, the oxide based conventional dielectric material has a dielectric constant k from about 3.6 to about 3.9. The low-k dielectric material typically has a dielectric constant k of about 3.0 or less, preferably less than about 2.8, and more preferably less than about 2.5.

Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the substrate-contact-via level dielectric material layer 40. The substrate-contact-via level dielectric material layer 40 may comprise the same material throughout, or the substrate-contact-via level dielectric material layer 40 may comprise a stack of at least two of the oxide based conventional dielectric material, the spin-on low-k dielectric material, and the CVD low-k dielectric material.

A first photoresist (not shown) is applied to the top surface of the substrate-contact-via level dielectric material layer 40 and lithographically patterned to form openings in the first photoresist. The pattern of the openings is transferred into the substrate-contact-via level dielectric material layer 40 to form first contact via holes 44 that extend to the top surface of the at least one semiconductor device in the semiconductor substrate 10 and second contact via holes 49 that extend to the at least one doped semiconductor well 18. The first photoresist is subsequently removed.

A second photoresist (not shown) is applied to the top surface of the substrate-contact-via level dielectric material layer 40 and lithographically patterned to form at least one opening in the second photoresist over a peripheral area of the first exemplary semiconductor structure. The first exemplary semiconductor structure may be a semiconductor die (semiconductor chip) or a semiconductor chiplet included in a semiconductor die. A semiconductor die may contain one or multiple semiconductor chiplets. Correspondingly, the peripheral area of the first exemplary semiconductor structure may be a peripheral area of a semiconductor chip or a peripheral area of a semiconductor chiplet contained within a semiconductor chip. In one case, the at least one trench 45 may be a single contiguous trench that laterally surrounds and encloses an inner portion of the semiconductor substrate 10.

The pattern in the at least one opening is transferred into the semiconductor substrate 10 to form at least one trench 45 that extends from a top surface of the substrate-contact-via level dielectric material layer 40 into the semiconductor substrate 10. The distance from the top surface of the semiconductor substrate to the bottom surface(s) of the at least one trench is less than the thickness of the semiconductor substrate 10, and may be from 50 microns to 700 microns, and typically from 300 microns to 600 microns, although lesser and greater distances are also contemplated herein. The width of the at least one trench between a facing pair of sidewalls may be from 0.5 micron to 20 microns, and typically from 1 micron to 5 microns, although lesser and greater widths are also contemplated herein. Typically, an anisotropic etch is employed to removed the semiconductor material of the semiconductor substrate selective to the material of the second photoresist. The second photoresist is subsequently removed.

Figure 2:
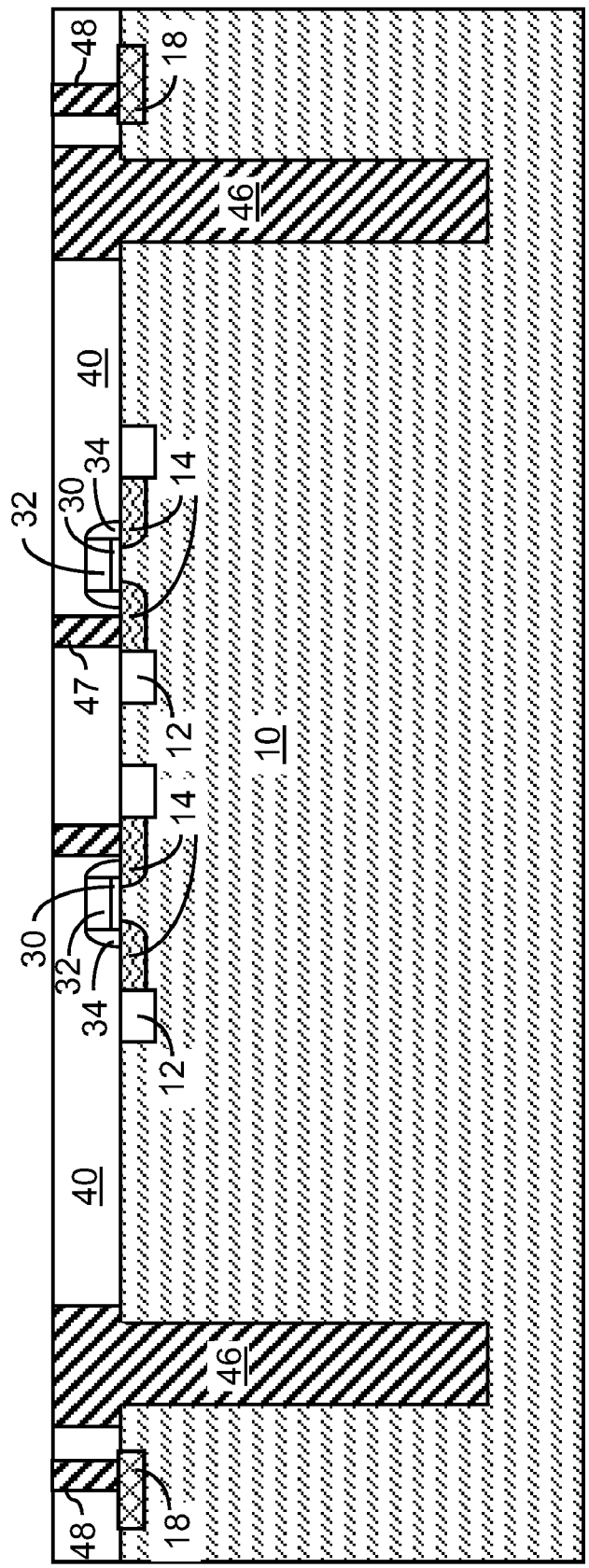

Referring to FIG. 2, a conductive material is deposited within the at least one trench 45, the first contact via holes 44, and the second contact via holes 49. The conductive material may be an elemental metal, an intermetallic alloy, a conductive metal nitride, a conductive metal-semiconductor alloy, a doped semiconductor material, or a combination thereof. Non-limiting examples of the elemental metal include Cu, Al, Ta, Ti, W, Co, Ni, Au, and Ag. The intermetallic alloy may be a binary intermetallic alloy, a ternary intermetallic alloy, or an intermetallic alloy including more than three elemental metals. Non-limiting exemplary materials for the conductive metal nitride include TaN, TiN, WN, and their compounds. Non-limiting examples of the conductive metal-semiconductor alloy include metal silicides, metal germanides, metal germano-silicides, and other conductive compounds of at least one metal and at least one semiconductor material. Non-limiting examples of the doped semiconductor material include doped polysilicon, doped epitaxial silicon, doped silicon-germanium alloy, and doped compound semiconductor materials.

The conductivity material may be deposited, for example, by chemical vapor deposition (CVD), physical vapor deposition (PVD), electroplating, electroless plating, evaporation in vacuum, or combination thereof. The conductive material is deposited directly on the sidewalls of the at least one trench 45, and laterally abuts the semiconductor substrate 10. Preferably, the portion of the conductive material that abuts the semiconductor substrate 10 comprises a material that does not diffuse into the semiconductor substrate 10 to interact with the semiconductor devices on the semiconductor substrate. In one case, a metallic liner material comprising a conductive metal nitride and functioning as a diffusion barrier layer may be formed directly on the sidewalls of the at least one trench 45 prior to depositing a conductive material such as metal that may diffuse into the semiconductor substrate to adversely impact device characteristics. In another case, the conductive material comprises a material that does not generate atoms that diffuse into the semiconductor substrate such as doped polysilicon.

The portion of the conductive material above the top surface of the substrate-contact-via level dielectric material layer 40 is removed, for example, by a recess etch, chemical mechanical planarization (CMP), or a combination thereof. The remaining portion(s) of the conductive material layer in the at least one trench 45 constitutes at least one through-substrate via 46 that extends from the top surface of the substrate-contact-via level dielectric material layer 40 into the semiconductor substrate 46. In one case, the at least one through-substrate via 46 is a single through-substrate via of unitary and integral construction that laterally surrounds and laterally encloses an inner portion of the semiconductor substrate 10. The remaining portions of the conductive material layer in the first contact via holes 44 constitute first substrate contact vias 47, which abuts various elements of the at least one semiconductor device so that electrical contact may be provided to the at least one semiconductor device. The remaining portions of the conductive material layer in the second contact via holes 48 constitute second substrate contact vias 48, which abuts the at least one semiconductor device.

Figure 3:
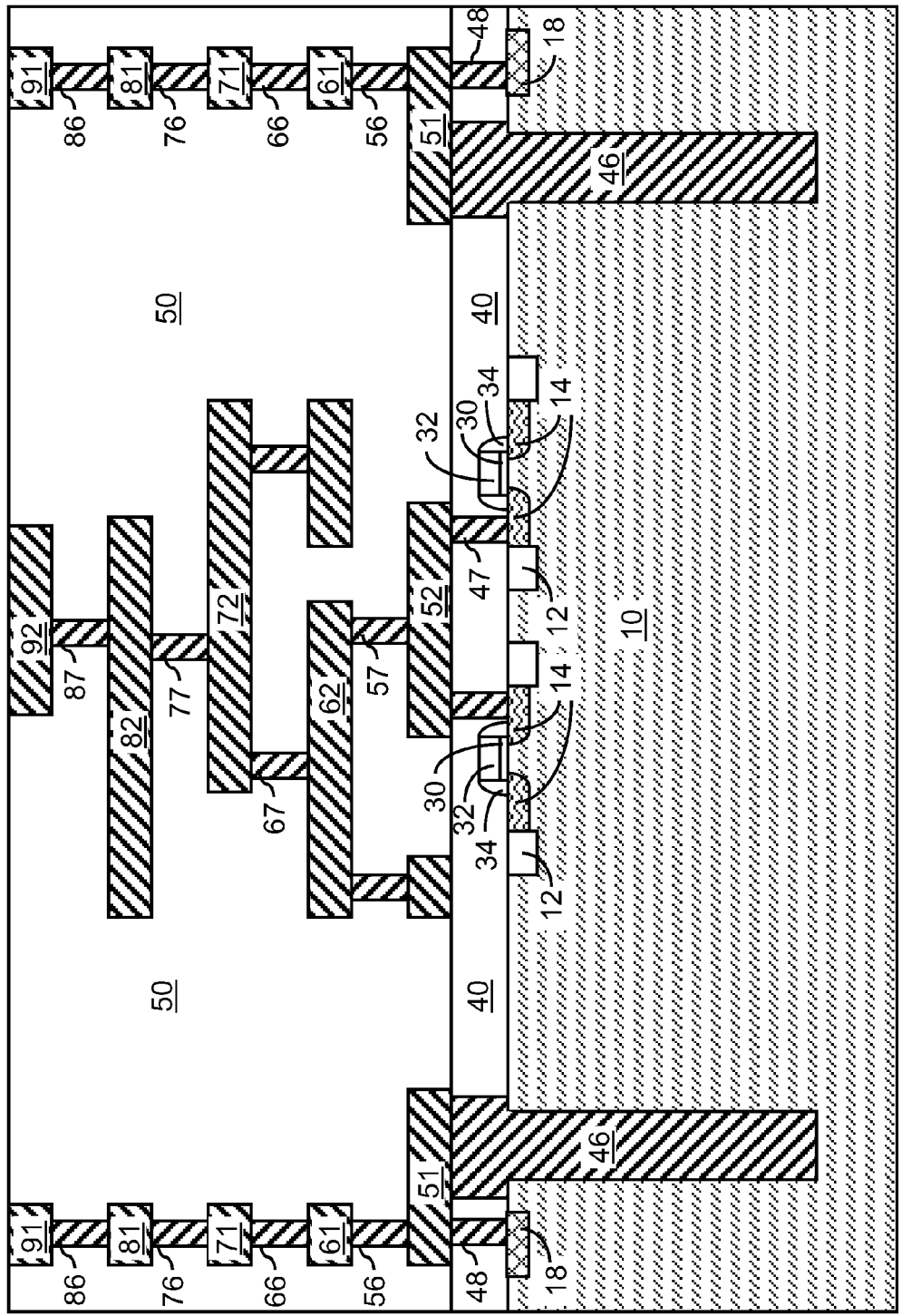

Referring to FIG. 3, at least one dielectric material layer 50 is formed over the substrate-contact-via level dielectric material layer 40, the at least one through-substrate via 46, the first substrate contact vias 47, and the second substrate contact vias 48. Various metal interconnect structures and a metallic enclosure structure are formed within the at least one dielectric material layer 50. The at least one dielectric material layer 50, the metal interconnect structures, and elements of the metallic enclosure structure may be formed level by level from bottom to top. Each level of the at least one dielectric material layer 50, the metal interconnect structures, and the elements of the metallic enclosure structure may be formed separately as in a single damascene integration scheme. Alternately, multiple levels of the at least one dielectric material layer 50, the metal interconnect structures, and the elements of the metallic enclosure structure may be formed employing common processing steps as in a dual damascene integration scheme. Each level of the at least one dielectric material layer 50 may comprise any of the material that may be employed for the substrate-contact-via level dielectric material layer 40 as described above.

The metal interconnect structures and the metallic enclosure structure are formed embedded within in the at least one dielectric material layer 50. Typically, via level dielectric material layers and line level dielectric material layers are alternately stacked within the at least one dielectric material layer 50. Dielectric passivation layers that provide protection against diffusion of moisture may be formed between two adjacent dielectric material layers.

For example, the metal interconnect structures may include at least one first-line-level metal line 52, at least one first-via-level metal via 57, at least one second-line-level metal line 62, at least one second-via-level metal via 67, at least one third-line-level metal line 72, at least one third-via-level metal via 77, at least one fourth-line-level metal line 82, at least one fourth-via-level metal via 67, and at least one metal pad 92. The at least one metal pad 92 has an exposed top surface that is substantially coplanar with a topmost surface of the metallic enclosure structure. The at least one metal pad 92 may be at least one C4 pad or at least one wirebond pad.

The metallic enclosure structure vertically abuts a top surface of the at least one through-substrate via 46 and the second substrate contact vias 48. The second substrate contact vias 48 stabilize the electrical potential of semiconductor substrate 10, and collect unwanted charge carriers, thereby preventing the injection of the charge carriers into the semiconductor substrate 10. The metallic enclosure structure is a single contiguous piece, and may comprise a first-line-level enclosure ring line 51, a first-via-level enclosure ring via 56, a second-line-level enclosure ring line 61, a second-via-level enclosure ring via 66, a third-line-level enclosure ring line 71, a third-via-level enclosure ring via 76, a fourth-line-level enclosure ring line 81, a fourth-via-level enclosure ring via 86, and a fifth-line-level enclosure ring line 91.

Each level of the metallic enclosure structure may be formed at the same time as the formation of the corresponding level of the metal interconnect structures. Thus, all metallic structures in the same level in the first exemplary structure may be formed at the same time, and the first exemplary structure is formed layer by layer from bottom to top.

All via level metallic structures within the same via level are located within the same vertical distance range from a top surface of the semiconductor substrate 10. Likewise, all line level metallic structures within the same line level are located within the same vertical distance range from the top surface of the semiconductor substrate 10. Each set of via level metallic structures and each set of line level metallic structures may be stratified. In this case, each set of via level metallic structures in the same via level have bottom surfaces that are substantially coplanar with top surfaces of the set of line level metallic structures in the line level directly underneath, if present, and have top surfaces that are substantially coplanar with bottom surfaces of the set of line level metallic structures in the line level located directly above, if present. Likewise, each set of line level metallic structures in the same line level have bottom surfaces that are substantially coplanar with top surfaces of the set of via level metallic structures in the via level directly underneath, if present, and have top surfaces that are substantially coplanar with bottom surfaces of the set of via level metallic structures in the via level located directly above, if present.

While the present invention is described with an exemplary set of metal interconnect structure including five via levels (including the via level containing the first substrate contact vias 47 and the second substrate contact vias 48) and five line levels, embodiments of the present invention in which any other number of via levels and line levels are employed are also contemplated herein.

Figure 4A:
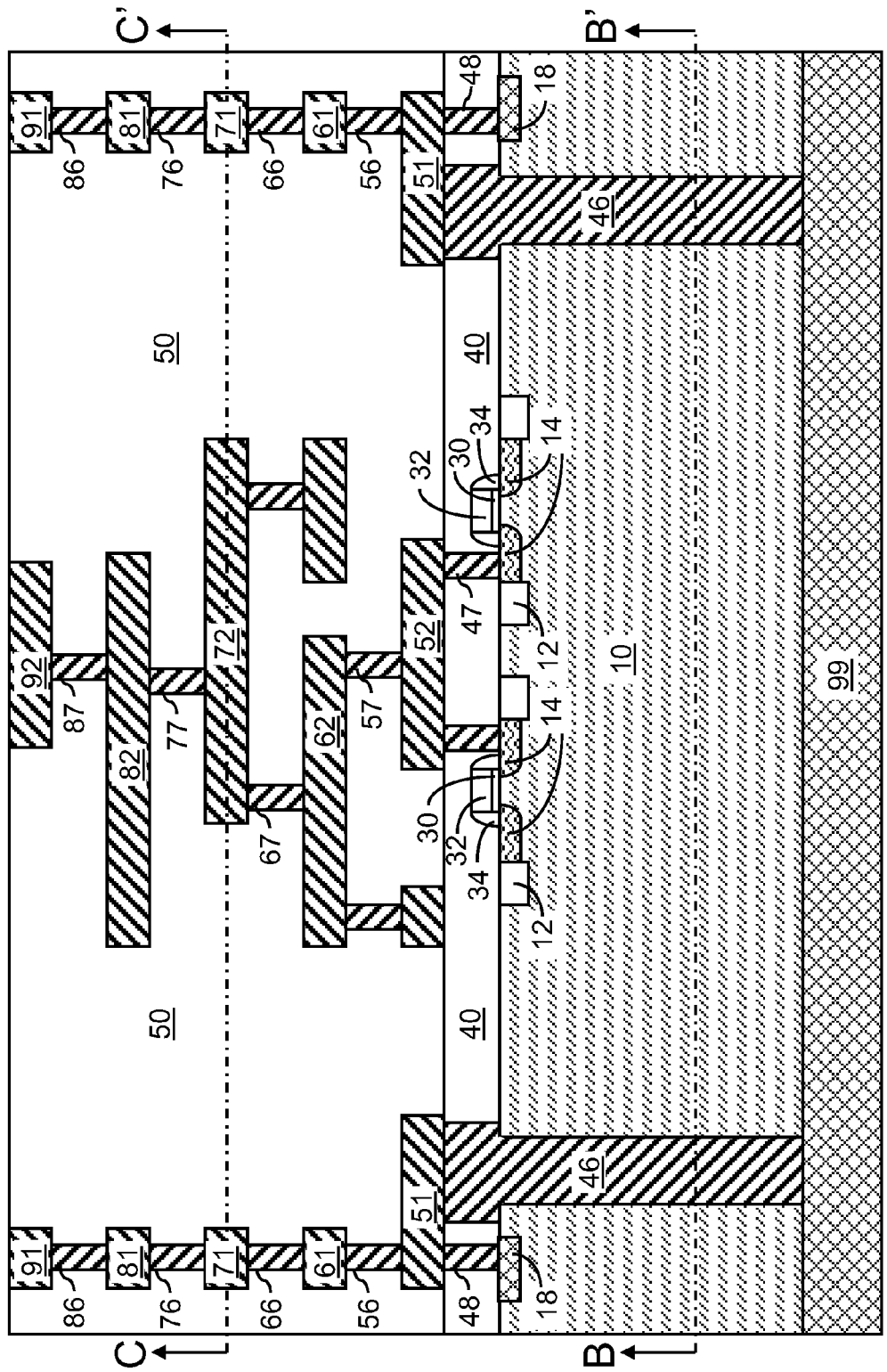
Figure 4B:
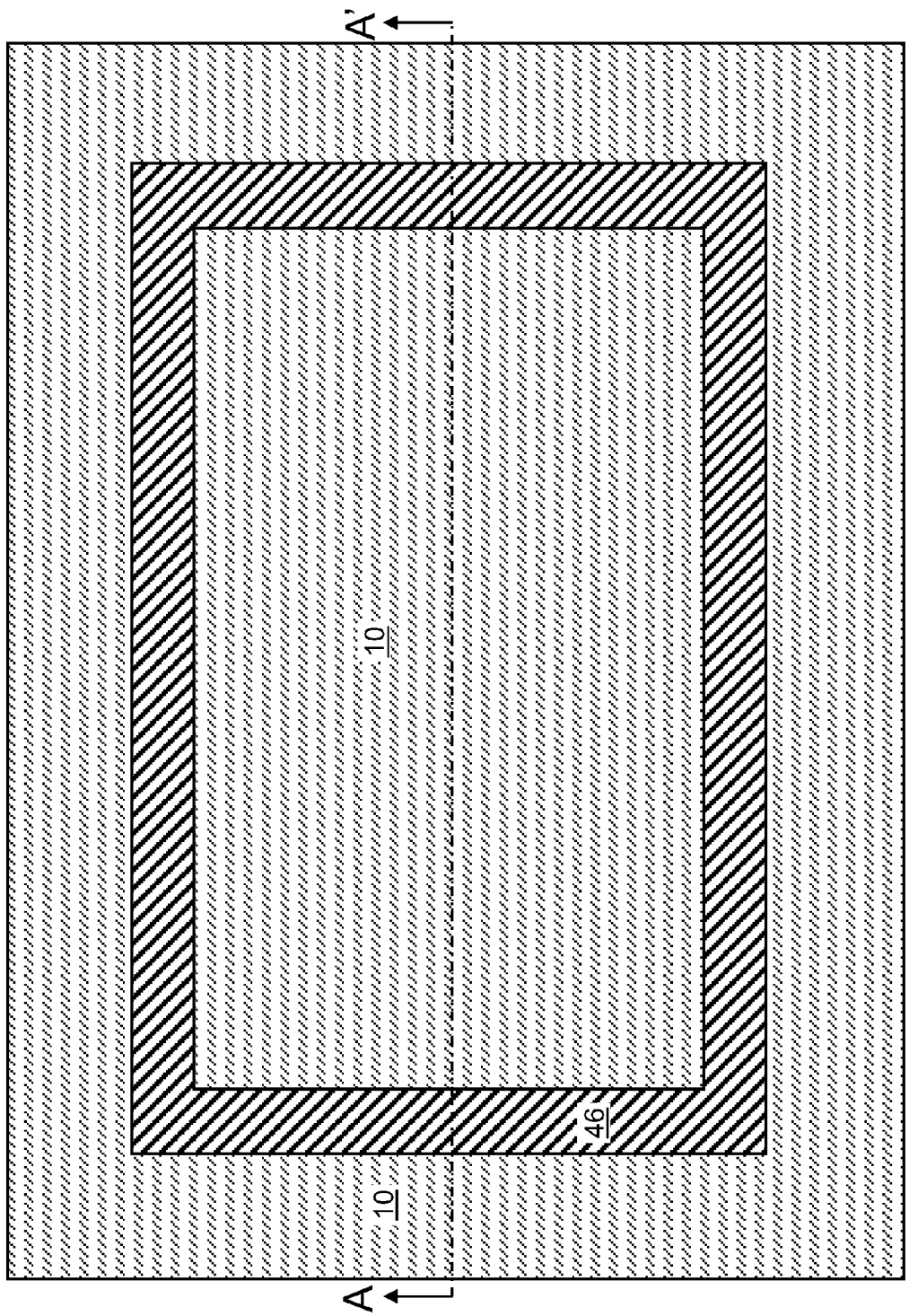
FIGS. 4B and 4C are horizontal cross-sectional views of the first exemplary semiconductor structure in FIG. 4A along the planes B-B' and C-C', respectively.
Figure 4C:
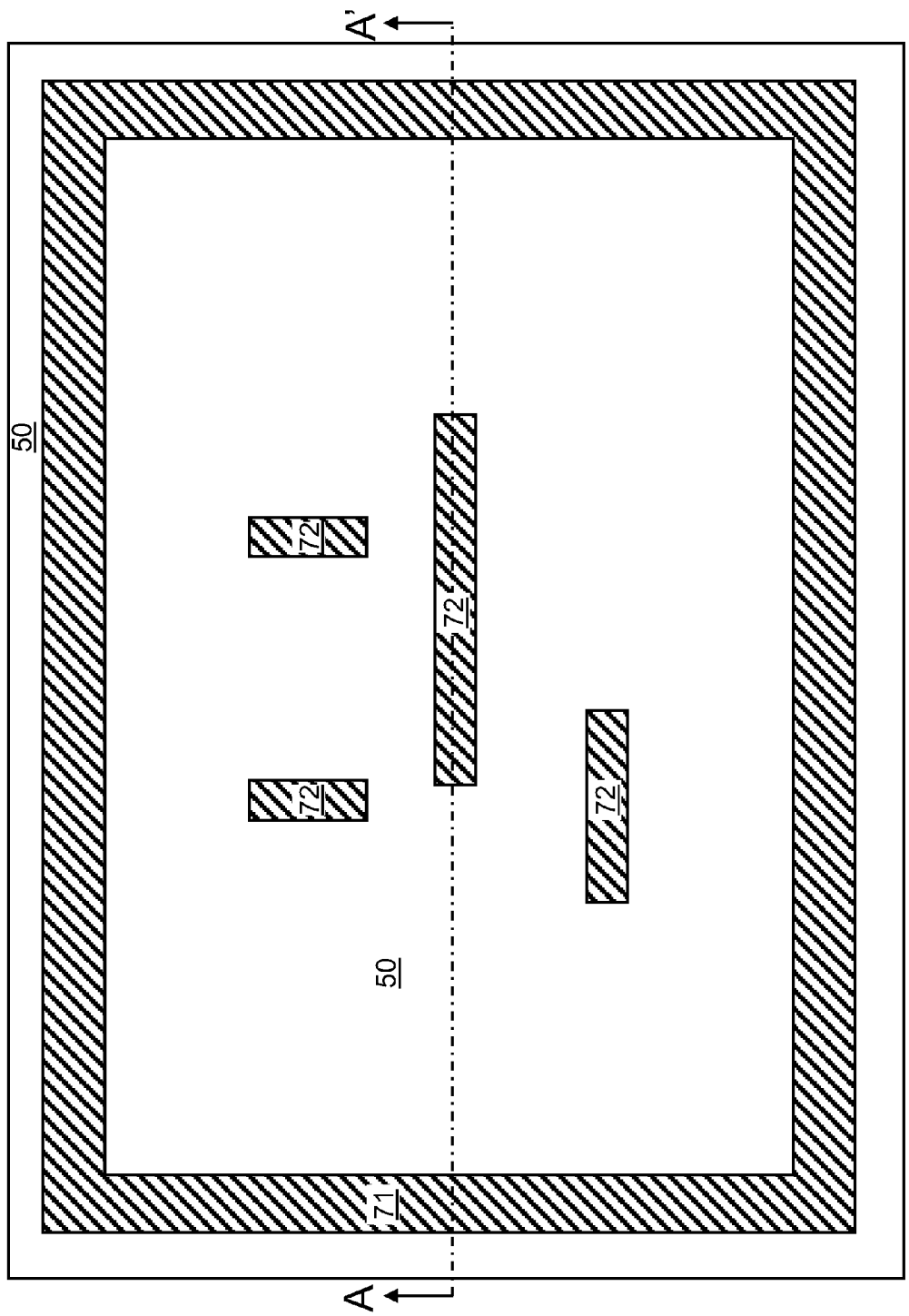

Referring to FIGS. 4A-4C, a backside portion of the semiconductor substrate 10 is removed to expose the bottom surface(s) of the at least one through-substrate via 46, for example, by grinding, polishing, etching, or a combination thereof. The semiconductor substrate 10 is correspondingly thinned. A metallic layer 99 is deposited on the backside surface of the semiconductor substrate 10 and the exposed bottom surface(s) of the at least one through-substrate via 46, for example, by electroplating, electroless plating, physical vapor deposition (PVD), chemical vapor deposition (CVD), or a combination thereof. The metallic layer 99 may comprise an elemental metal, an intermetallic alloy, a conductive metal nitride, or a combination thereof. The thickness of the metallic layer 99 may be from 10 nm to 5 microns, and typically from 50 nm to 1 micron, although lesser and greater thicknesses are also contemplated herein.

The at least one through-substrate via 46 extends from the bottom surface of the semiconductor substrate 10 and at least to the top surface of the semiconductor substrate 10, and specifically, to the top surface of the substrate-contact-via level dielectric material layer 40. The at least one through-substrate via 46 laterally abuts the semiconductor substrate 10. The at least one through-substrate via 46 is located within a peripheral region of the semiconductor substrate 10. The at least one through-substrate via 46 is embedded in the semiconductor substrate 10. In one case, the at least one through-substrate via 46 is a single through-substrate via of unitary and integral construction that laterally surrounds and laterally encloses an inner portion of the semiconductor substrate 10.

The metallic enclosure structure laterally surrounds and encloses an inner portion of the at least one dielectric material layer 50. The metallic enclosure structure vertically abuts a top surface of the at least one through-substrate via 46. The outer portion of at least one dielectric material layer 50 laterally surrounds and encloses the metallic enclosure structure. The metallic enclosure structure is a single contiguous structure extending from the top surface of the at least one through-substrate via 46 to the topmost surface of the at least one dielectric material layer 50. The metallic enclosure structure structurally isolates the inner portion of the at least one dielectric material layer 50 from the outer portion of the at least one dielectric material layer 50, and functions as a diffusion barrier for impurities and moisture, providing protection to the at least one semiconductor device encapsulated by the at least one dielectric material layer 50, the substrate-contact-level dielectric material layer 40, and the semiconductor substrate 10. The inner portion of the at least one dielectric material layer 50 is separated from, and does not abut, the outer portion of the at least one dielectric material layer 50.

The at least one through-substrate via 46 is not electrically wired to the metal pad 92 through any metal interconnect structure in the at least one dielectric material layer 50. The electrical grounding of the at least one semiconductor device on the semiconductor substrate 10 can be achieved by at least one through-substrate via 46 and metal interconnect structures embedded in the at least one dielectric material layer 50. All of the at least one through-substrate via 46 within the semiconductor substrate 10 is electrically connected to the metallic layer 99, which is electrically grounded during chip packaging. The wafer back side metallization effected by the metallic layer 99 provides high electrical conductivity. There is no need for a metal pad that is dedicated for providing electrical grounding of the semiconductor chip's guard ring. Thus, the number of total metal pads in a chip design may be reduced as the need for metal pads dedicated to electrical grounding of the guard ring is eliminated.

The at least one semiconductor device is directly grounded through the at least one through-substrate via 46, instead of being grounded to any ground metal pad by the metal interconnect structures in the at least one dielectric material layer 50. Thus, the need for any ground metal pad is eliminated. In addition, the need for metal interconnect structures dedicated to connecting the at least one semiconductor device to any ground metal pad is also eliminated. The additional area that becomes available may be employed to increasing wiring density for the semiconductor devices on the semiconductor substrate 10. Thus, the present invention reduces ground inductance and improves power gain in a semiconductor chip. In this case, electrical grounding of the at least one semiconductor devices on the semiconductor substrate 10 to the at least one through-substrate via 46 provides enhanced signal isolation and signal shielding.

In case the at least one through-substrate via 46 is a single through-substrate via of unitary and integral construction, the at least one through-substrate via 46 functions as a diffusion barrier structure for impurities and moisture. Typically, the at least one dielectric material layer 50 includes a passivation layer (not shown) located at the topmost level of the at least one dielectric material layer 50. The passivation layer, the metallic enclosure structure, the at least one through-substrate via 46, and the metallic layer 99 encapsulates the inner portion of the semiconductor substrate 10 and the at least one semiconductor device, thereby enhancing the reliability of the at least one semiconductor device.

Figure 5:
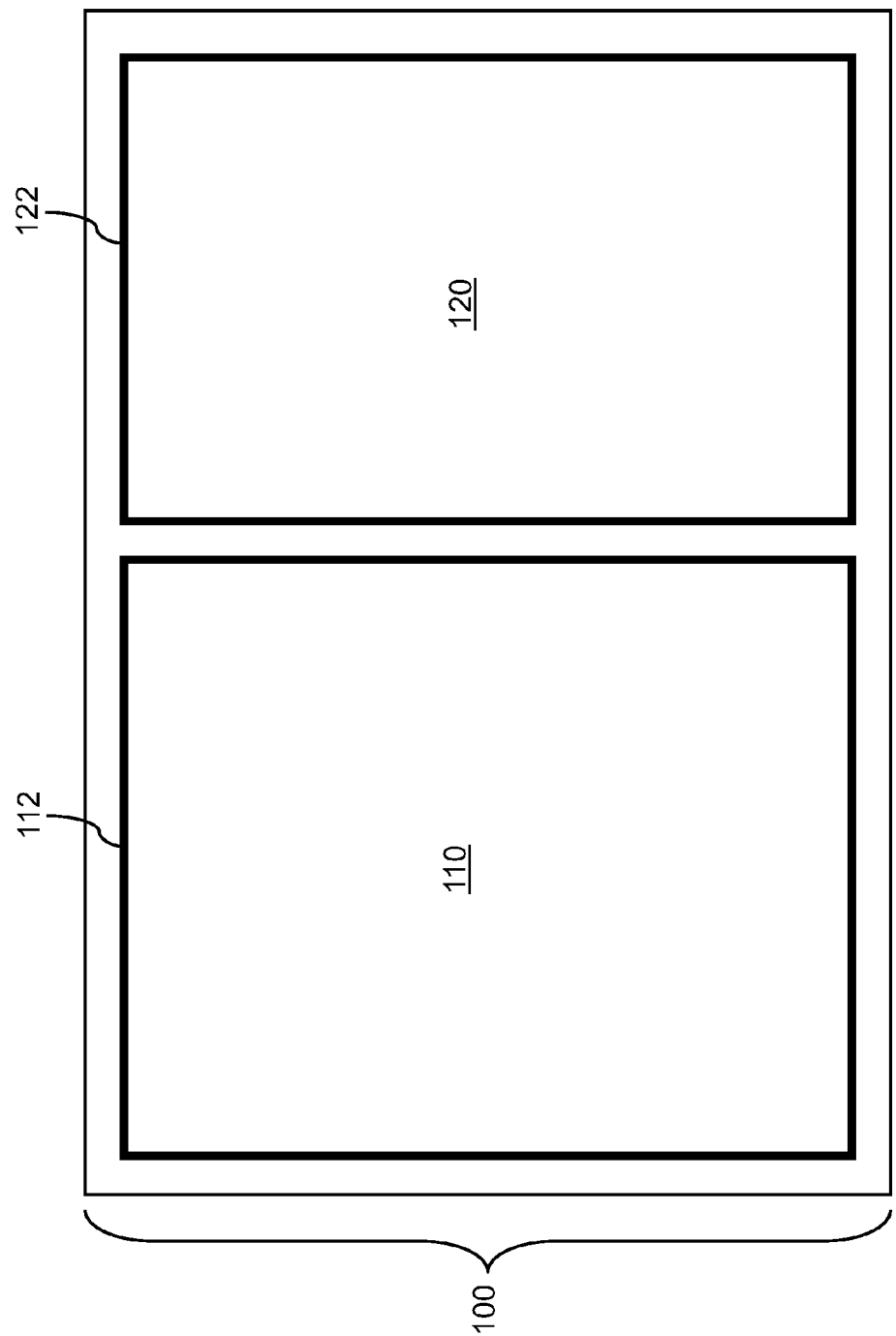
FIG. 5 is a schematic top-down view of an exemplary semiconductor chip showing the location of chip grounding structures.

Referring to FIG. 5, a schematic top-down view of an exemplary semiconductor chip 100 is shown. The exemplary semiconductor chip 100 includes a first chiplet 110 and a second chiplet 120. A first stack 112 of at least one first through-substrate via and a first metallic enclosure structure is located around the periphery of the first chiplet 110. A second stack 122 of at least one second through-substrate via and a second metallic enclosure structure is located around the periphery of the second chiplet 120. Each of the first stack 112 and the second stack 122 may be the same as, or derived from, the stack of the at least one through substrate via 46 and the metallic enclosure structure in the first exemplary semiconductor structure. In general, a semiconductor chip may include a single chiplet, which includes a single stack of at least one through substrate via and a metallic enclosure structure, or may include a plurality of chiplets, each of which includes a stack of at least one through substrate via and a metallic enclosure structure.

Figure 6:
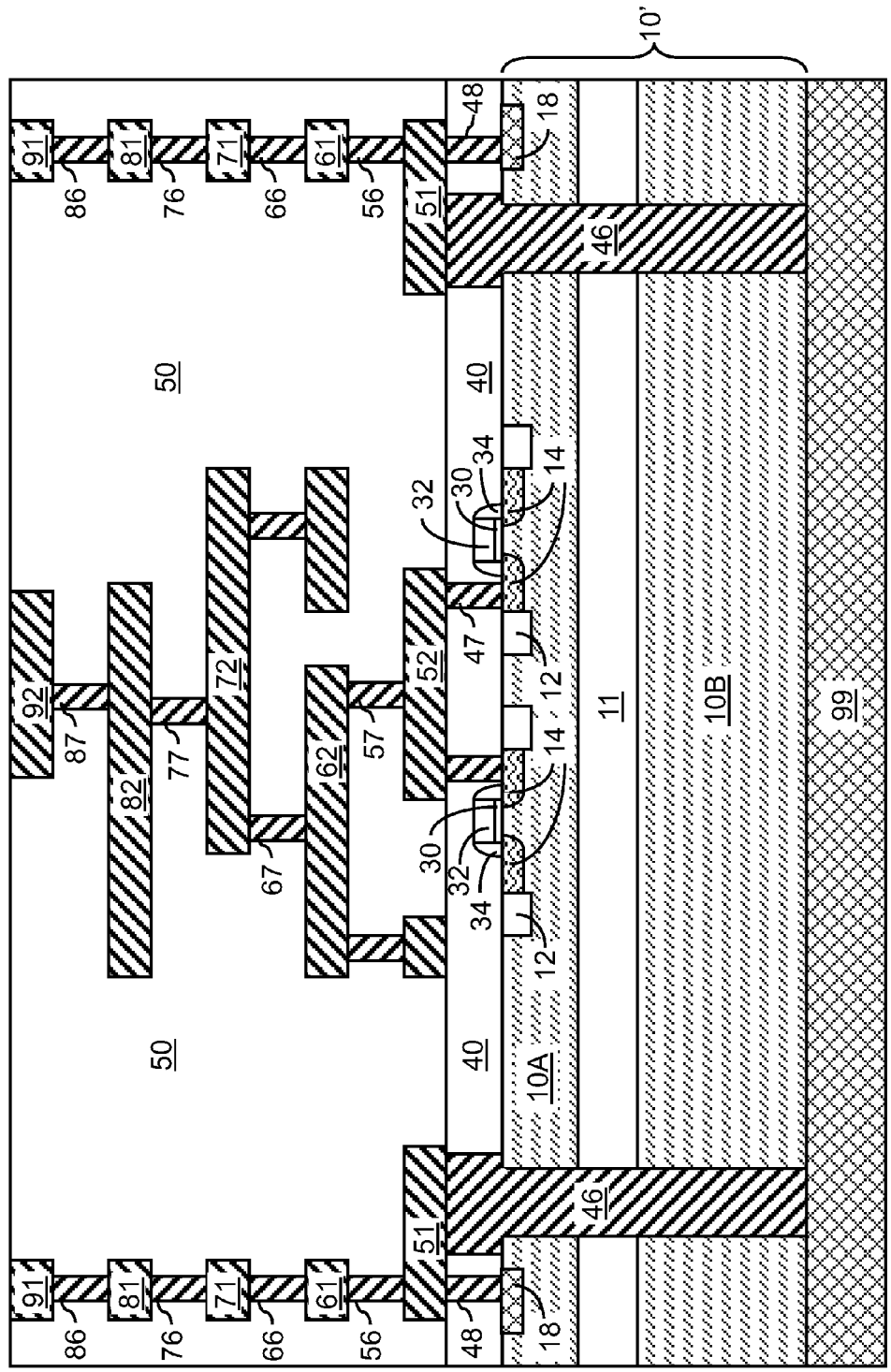
FIG. 6 is a vertical cross-sectional view of a second exemplary semiconductor structure according to a second embodiment of the present invention.

Referring to FIG. 6, a second exemplary semiconductor structure according to a second embodiment of the present invention is derived from the first exemplary semiconductor structure by employing a semiconductor-on-insulator (SOI) substrate instead of a bulk substrate. In the second embodiment, the semiconductor substrate 10' comprises a top semiconductor layer 10A, a buried insulator layer 11, and a handle substrate 10B. The top semiconductor layer 10A comprises a semiconductor material, which may be any semiconductor material that may be employed for the semiconductor substrate 10 in the first embodiment. The buried insulator layer 11 comprises a dielectric material such as silicon oxide, silicon nitride, silicon oxynitride, or a combination thereof.

The handle substrate 10B may comprise a conductive material, a semiconductor material, or an insulator material. The metallic layer 99 provides electrical grounding for the semiconductor devices in the semiconductor substrate 10. The bottom surface of the metallic layer 99 is grounded through an electrical contact during packaging.

Figure 7:
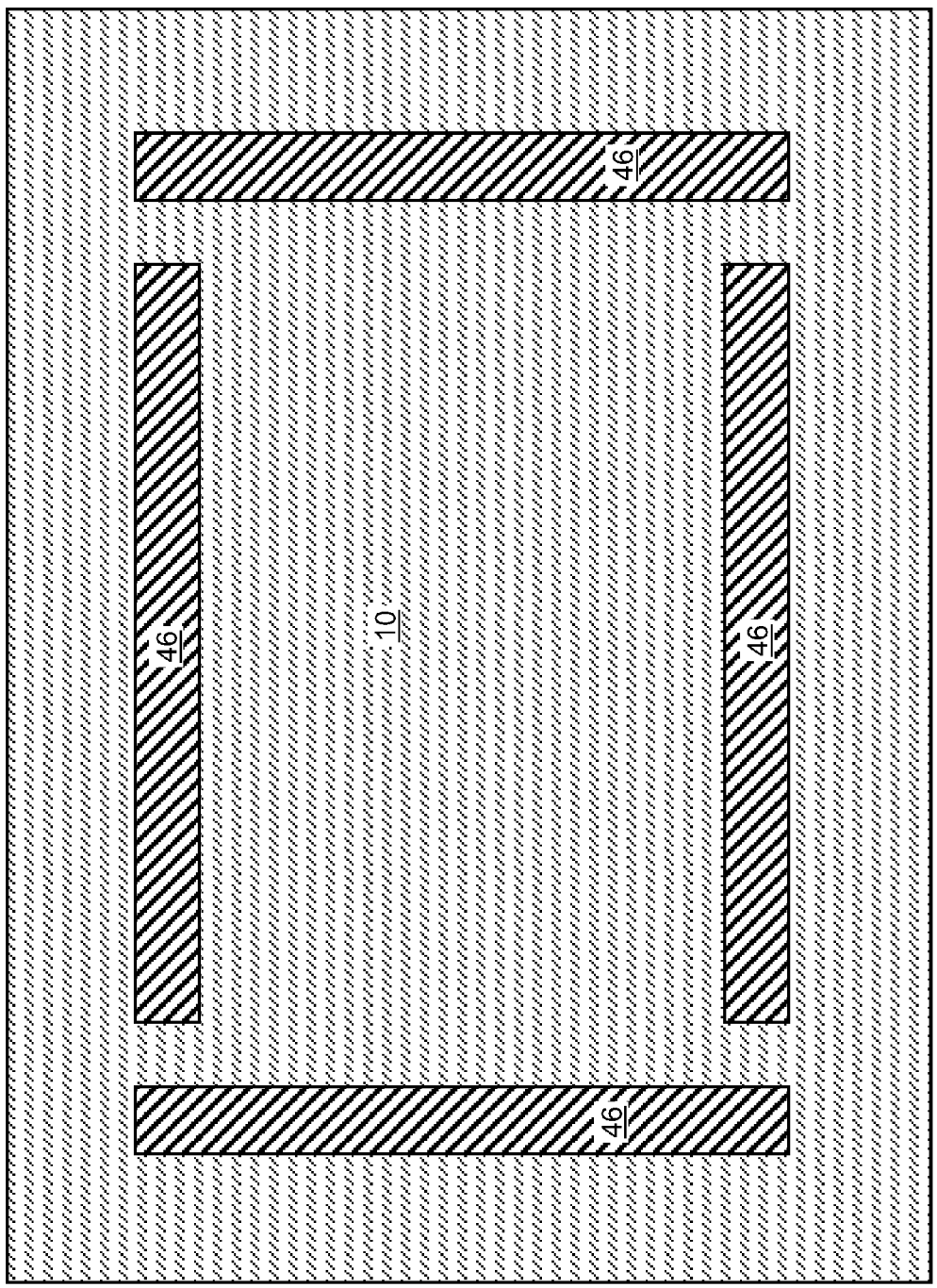
FIG. 7 is a horizontal cross-sectional view of a third exemplary semiconductor structure according to a third embodiment of the present invention along a plane corresponding to B-B' in FIG. 4A.

Referring to FIG. 7, a third exemplary semiconductor structure according to a third embodiment of the present invention is shown. FIG. 7 is a horizontal cross-sectional view of the third exemplary semiconductor structure at a plane corresponding to the plane B-B' in FIG. 4A. The vertical cross-sectional view of the third exemplary semiconductor structure may be identical to FIG. 4A of the first embodiment.

In the third embodiment, the at least one through-substrate via 46 is a plurality of through-substrate vias. Each through-substrate via in the plurality of through-substrate vias does not abut one another. All other elements of the third exemplary semiconductor structure may be the same as in the first exemplary semiconductor structure.

The plurality of through substrate vias is formed in peripheral area of the third exemplary semiconductor structure. The third exemplary semiconductor structure may be a semiconductor die (semiconductor chip) or a semiconductor chiplet included in a semiconductor die. Correspondingly, the peripheral area of the third exemplary semiconductor structure may be a peripheral area of a semiconductor chip or a peripheral area of a semiconductor chiplet contained within a semiconductor chip. The at least one through-substrate via 46 in the form of a plurality of through substrate vias in the third exemplary semiconductor structure enhances electrical grounding of at least one semiconductor devices as in the first embodiment, which includes at least one through-substrate via 46 in the form of a single through-substrate via of unitary and integral construction.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor device located on a semiconductor substrate;
   at least one through-substrate via extending from a bottom surface of said semiconductor substrate and at least to a top surface of said semiconductor substrate and located within a peripheral region of said semiconductor substrate;
   at least one dielectric material layer located on said semiconductor device and embedding at least one metal interconnect structure;
   a metallic enclosure structure laterally surrounding and enclosing an inner portion of said at least one dielectric material layer and vertically abutting a top surface of said at least one through-substrate via; and
   a metallic layer vertically abutting a bottom surface of said at least one through-substrate via and a bottom surface of said semiconductor substrate.

2. The semiconductor structure of claim 1, further comprising at least one substrate contact via abutting a top surface of said semiconductor substrate and a bottom surface of said metal enclosure structure.

3. The semiconductor structure of claim 2, further comprising at least one doped semiconductor well located in said semiconductor substrate and vertically contacting said at least one substrate contact via.

4. The semiconductor structure of claim 2, wherein said at least one through-substrate via is a single through-substrate via of unitary and integral construction that laterally surrounds and laterally encloses an inner portion of said semiconductor substrate and is resistively connected to said at least one substrate contact via through said metallic enclosure structure.

5. The semiconductor structure of claim 1, wherein said at least one through-substrate via is embedded in said semiconductor substrate, wherein said semiconductor substrate is a bulk substrate, a semiconductor-on-insulator (SOI) substrate, or a hybrid substrate having a bulk portion and a semiconductor-on-insulator portion, and wherein said at least one through-substrate via comprises an elemental metal, an intermetallic alloy, a conductive metal nitride, a conductive metal-semiconductor alloy, or a doped semiconductor material.

6. The semiconductor structure of claim 1, wherein an outer portion of at least one dielectric material layer laterally surrounds and encloses said metallic enclosure structure.

7. The semiconductor structure of claim 6, wherein said metallic enclosure structure is a single contiguous structure extending from a top surface of said at least one through-substrate via to a topmost surface of said at least one dielectric material layer, wherein said inner portion of said at least one dielectric material layer is separated from, and does not abut, said outer portion of said at least one dielectric material layer.

8. The semiconductor structure of claim 1, wherein said at least one metal interconnect structure includes at least one metal pad having an exposed top surface that is substantially coplanar with a topmost surface of said metallic enclosure structure.

9. The semiconductor structure of claim 8, wherein said at least one through-substrate via is not electrically wired to said at least one metal pad through any metal interconnect structure in said at least one dielectric material layer.

10. The semiconductor structure of claim 8, wherein said at least one through-substrate via is electrically wired to said at least one metal pad through said at least one metal interconnect structure in said at least one dielectric material layer.

11. The semiconductor structure of claim 1, wherein said at least one through-substrate via is a plurality of through-substrate vias.

12. The semiconductor structure of claim 1, wherein said at least one through-substrate via laterally abuts said semiconductor substrate.

13. A method of forming a semiconductor structure comprising:
    forming at least one through-substrate via and at least one substrate contact via within a peripheral region of a semiconductor substrate;
    forming at least one dielectric material layer and at least one metal interconnect structure embedded therein on said semiconductor substrate;
    forming a metallic enclosure structure directly on a top surface of said at least one through-substrate via, wherein said metallic enclosure structure laterally surrounds and encloses an inner portion of said at least one dielectric material layer; and
    forming a metallic layer directly on a bottom surface of said at least one through-substrate via and a bottom surface of said semiconductor substrate.

14. The method of claim 13, wherein said at least one through-substrate via is a single through-substrate via of unitary and integral construction that laterally surrounds and laterally encloses said semiconductor substrate.

15. The method of claim 13, wherein said metallic enclosure structure is a single contiguous structure extending from a top surface of said at least one through-substrate via to a topmost surface of said at least one dielectric material layer, and wherein an inner portion of said at least one dielectric material layer is separated from, and does not abut, an outer portion of said at least one dielectric material layer.

16. The method of claim 13, further comprising forming at least one metal pad having an exposed top surface that is substantially coplanar with a topmost surface of said metallic enclosure structure.

17. The method of claim 16, wherein said at least one through-substrate via is not electrically wired to said at least one metal pad through any metal interconnect structure in said at least one dielectric material layer.

18. The method of claim 16, wherein said at least one through-substrate via is electrically wired to said at least one metal pad through said at least one metal interconnect structure in said at least one dielectric material layer.

19. The method of claim 13, further comprising removing a bottom portion of said semiconductor substrate and exposing said bottom surface of said at least one through-substrate via prior to forming said metallic layer.

20. The method of claim 13, further comprising forming at least one semiconductor device on said semiconductor substrate, wherein said at least one semiconductor device is electrically grounded through said at least one substrate contact via, said metallic enclosure structure, and said at least one through-substrate via to said metallic layer, and wherein said metallic layer is electrically grounded during packaging of a semiconductor chip including said semiconductor substrate.

* * * * *